United States Patent [19]

Prince

[11] 4,360,745
[45] Nov. 23, 1982

[54] DEPLETION CAPACITANCE COMPENSATOR

[75] Inventor: Paul R. Prince, Fountain Valley, Calif.

[73] Assignee: Hughes Aircraft Company, Culver City, Calif.

[21] Appl. No.: 266,699

[22] Filed: May 26, 1981

Related U.S. Application Data

[63] Continuation of Ser. No. 83,425, Oct. 10, 1979, abandoned.

[51] Int. Cl.³ .................. H03K 3/353; G11C 19/28; H01L 29/78
[52] U.S. Cl. .................. 307/304; 307/221 D; 357/24
[58] Field of Search .............. 357/24 R; 307/221 D, 307/304

[56] References Cited

U.S. PATENT DOCUMENTS

| | | | |
|---|---|---|---|
| 3,789,267 | 1/1974 | Krambeck et al. | 357/24 R |
| 3,819,958 | 6/1974 | Gosney | 357/24 R |
| 3,987,475 | 10/1976 | Ibrahim | 357/24 R |
| 4,035,666 | 7/1977 | Collins et al. | 357/24 R |
| 4,048,525 | 9/1977 | Goldberg et al. | 357/24 R |
| 4,090,095 | 5/1978 | Herrmann | 357/24 R |
| 4,240,089 | 12/1980 | Engeler | 357/24 R |

*Primary Examiner*—Gene M. Munson
*Attorney, Agent, or Firm*—R. M. Wallace; W. J. Bethurum; W. H. MacAllister

[57] ABSTRACT

The capacitance of a compensating reverse biased diode is added to the capacitance of a pn junction formed by surface depletion and inversion in a charge coupled device having variations in depletion capacitance which are to be compensated. Because the compensating diode is connected in an opposite sense with respect to the pn junction, an increase in small signal variations in the potential across the pn junction causes a decrease in small signal variations in the potential across the compensating diode. The resulting change in the capacitance of the pn junction is accompanied by a corresponding opposite change in the capacitance of the compensating diode so that the combined capacitance of the two elements remains nearly constant during all small signal variations in potential.

10 Claims, 17 Drawing Figures

DEPLETION CAPACITANCE COMPENSATOR

This is a continuation of application Ser. No. 083,425 filed Oct. 10, 1979 now abandoned.

TECHNICAL FIELD

This invention relates to charge coupled devices requiring a linear relationship between charge and voltage, and specifically to devices in which mechanisms are provided to compensate for non-linearities between depletion capacitance and voltage.

BACKGROUND ART

The rapidly developing field of charge coupled devices and imaging systems has been troubled from the beginning by the non-linear relationship between voltage and charge in semiconductor junctions. It is well known that the capacitance of semiconductive junctions varies approximately as a function of the reciprocal of the square root of the voltage across the junction, which causes the voltage to be a non-linear function of charge stored in the junction. The outstanding promise of charge coupled devices is in the enormous signal processing capability which is available when signals are converted to charge packets which may be processed very efficiently. However, if the input signal is converted with non-linear distortion into charge, the error associated with complex linear signal processing of non-linear charge cannot be recovered. Many varied circuits have been developed to provide an effective linearization at the input of charge coupled devices, as discussed below. At the output of such charge coupled devices, however, only the most complicated charge amplifier configurations provide acceptable linearity for most signal processing applications. These techniques reduce yield, increase power consumption and add substantial noise at the output, which limits performance. An order of magnitude improvement is needed without disadvantages of the current linearization techniques. Significant effort has been invested by the semiconductor industry toward this end. Specifically, a technique discussed in M. F. Tompsett, "Surface Potential Equilibration Method of Setting Charge in Charge Coupled Devices," *IEEE Transactions on Electron Devices,* Vol. ED-22, No. 6, June 1975, p. 305, overcame the thermal and voltage sensitivities of early charge coupled device diffusion input techniques. This technique includes non-linearities associated with depletion capacitance if a differential input is required.

Other techniques have been proposed to provide linearity between the input and the output of a charge coupled device. For example, D. J. MacLennan, "Linearization of the Charge Coupled Device Transfer Function," 1975 *Proceedings of the International Conference on the Application of Charge Coupled Devices,* p. 291, October 1975, discloses an operational amplifier at the charge coupled device input with feedback from an input floating gate. The techniques disclosed in R. W. Broderson, et al., "A 500-State CCD Transversal Filter for Spectral Analysis," *IEEE Transactions on Electron Devices,* Vol. ED-23, pp. 143–152, 1976 and C. H. Sequin, et al., "Self-Contained Charge Coupled Split-Electrode Filters Using a Novel Sensing Technique", *IEEE Journal of Solid-State Circuits,* SC-12, p. 626, December 1977, both involve a voltage signal applied to the input diffusion of a charge coupled device, but require output feedback to the sense electrode at a fixed potential. Such output feedback usually adds noise to the output signal and requires complex circuitry. The method disclosed in Y. A. Haque and M. A. Copeland, "Design and Characterization of a Real-Time Correlator," *IEEE Journal of Solid-State Circuits,* Vol. SC-12, p. 642, December, 1977, uses the voltage input technique of the Broaderson publication, but does not have a perfectly linear output. Finally, the technique discussed in C. R. Hewes, "A Self-Contained 800 Stage CCD Transversal Filter," *Proceedings of the 1975 International Conference on the Application of Charge Coupled Devices,* p. 309. October, 1975, employs a diffusion input scheme in a charge coupled device to compensate output non-linearities, which makes the intermediate signal processing non-linear. Thus, the prior art has used charge injection and charge sensing techniques which involve a non-linear relationship between charge and voltage because the device capacitance is not constant.

SUMMARY OF THE INVENTION

The foregoing problems are overcome in this invention in which the capacitance of a compensating "np" reverse biased diode is added to the capacitance of a pn junction formed by surface inversion in a charge coupled device having variations in depletion capacitance which are to be compensated. Because the compensating diode is connected in an opposite sense with respect to the pn junction, an increase in the bias voltage across the pn junction is accompanied by a decrease in the bias voltage across the compensating diode. The resulting change in the capacitance of the pn junction is accompanied by a corresponding opposite change in the capacitance of the compensating diode so that the combined capacitance of the two elements remains nearly constant during all small signal variations in applied voltage. Therefore, the compensating np diode nearly cancels variations in the depletion capacitance of the pn junction. In one embodiment of the invention, the compensating diode is connected to the electrode overlying the substrate surface of a charge coupled device to compensate for variations in the depletion capacitance of the substrate.

Linearization of charge injected into a charge coupled device as a function of applied voltage is achieved in this invention by providing a depletion capacitance compensating diode in parallel with the capacitance of an electrode controlling charge injected from a forward biased input diffusion. In charge sensing devices linearization of the output voltage as a function of charge is also achieved in this invention by providing a depletion capacitance compensating diode in parallel with the capacitance of a charge sensing floating diffusion. Alternatively, a depletion capacitance compensating diode is connected to a charge sensing floating electrode to linearize the voltage response of the sensing electrode with respect to the amount of charge sensed by the electrode.

BRIEF DESCRIPTION OF THE DRAWINGS

The invention as best understood by reference to the accompanying drawings of which.

DETAILED DESCRIPTION OF THE INVENTION

Figure 1:
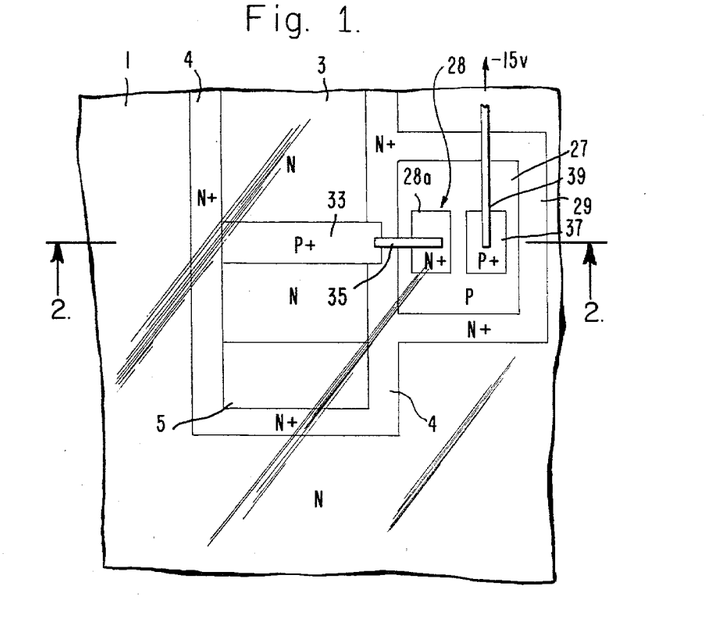
FIG. 1 is a top view of a p-channel charge coupled device illustrating the depletion capacitance compensation of this invention in a charge injection structure.
Figure 2:
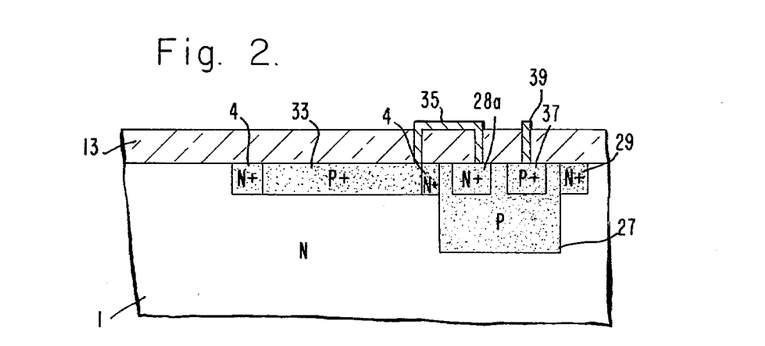
FIG. 2 is a cross-sectional view taken along lines 2—2 of FIG. 1 and showing an overlying layer of silicon dioxide not shown in FIG. 1.
Figure 3:
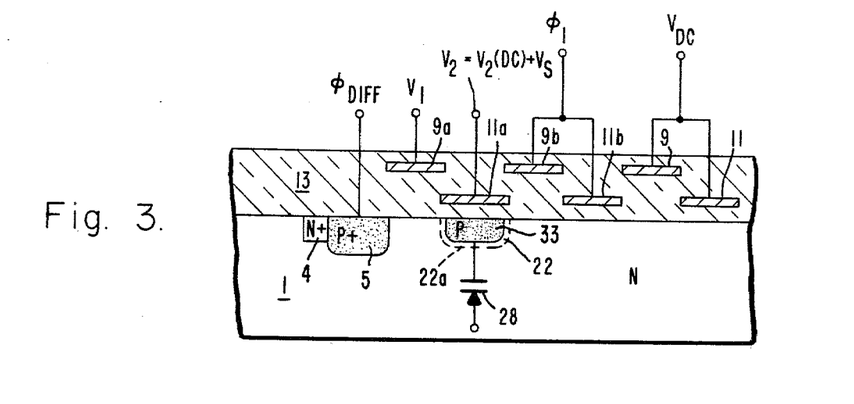
FIG. 3 is a schematic diagram corresponding to FIG. 1.
Figure 15A:
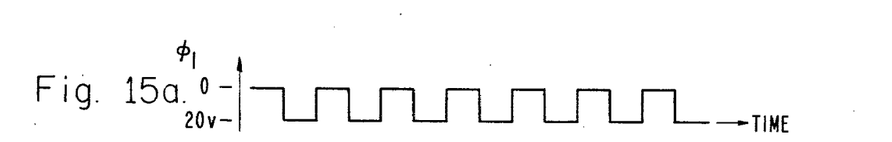
FIGS. 15a and b include diagrams of the time domain waveforms of clock signals applied to the devices illustrated in FIGS. 1–14.

Referring to FIGS. 1, 2 and 3, a p-channel charge coupled device of a type well known in the art is formed on the top surface of a semiconductive substrate 1 of n-type conductivity and includes a charge flow channel 3 defined by a channel stop 4 of increased n-type conductivity in the surface of the substrate 1. Charge is injected into the channel 3 from an input diode p-type diffusion 5 which is alternately elevated and depressed in potential under the control of a diffusion clock signal $\phi_{diff}$. A plurality of upper and lower level electrodes 9 and 11 are formed in an insulating layer 13 of silicon dioxide overlying the substrate 1 and control charge transfer in the charge flow channel 3 in a manner well known in the art as discussed in Sequin et al., *Charge Transfer Devices*, Academic Press, 1975. An upper level electrode 9a adjacent the input diffusion 5 is connected to a constant voltage source $V_1$ while an adjacent input control electrode 11a is connected to receive an electrode voltage $V_2$ having an offset component $V_2$ (DC) and a signal voltage component $V_s$. Alternate pairs of adjacent upper and lower level electrodes 9b, 11b and others not shown are connected to receive a clock signal $\phi_1$ from a clock generator while the remaining pairs receive a d.c. voltage $V_{dc}$. In the preferred embodiment, the clock signal $\phi_1$ is a pulse train having a time domain waveform illustrated in FIG. 15a.

Figure 4:
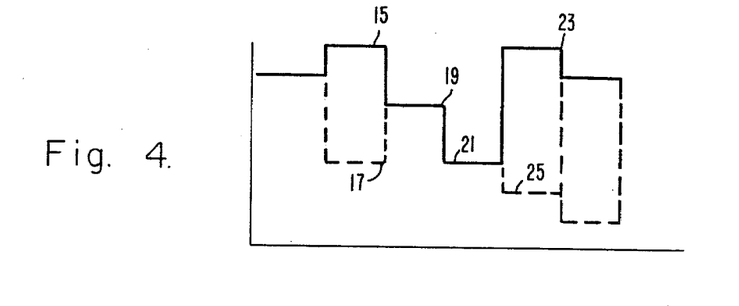
FIG. 4 is a diagram of the electrical surface potential corresponding to the schematic diagram of FIG. 3.
Figure 15B:
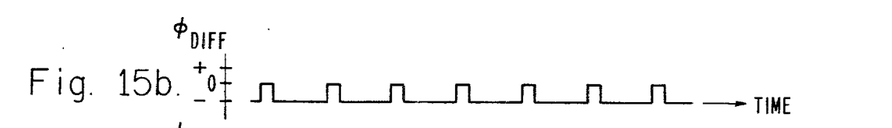
Figure 16:
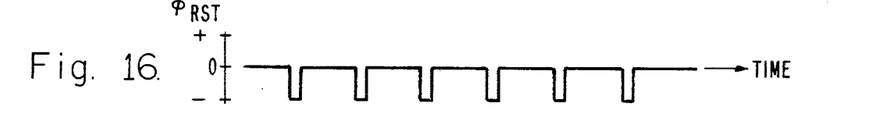
FIG. 16 is a diagram of the time domain waveform of a reset clock signal applied to the devices illustrated in FIGS. 7–14.

The approximated electrical surface potential in the substrate 1 corresponding to the schematic diagram of FIG. 3 is shown in FIG. 4. The diffusion clock signal $\phi_{diff}$ alternates according to the time domain waveform illustrated in FIG. 15b, to cause the underlying surface potential in the diode diffusion 5 to alternate between the solid line potential 15 and the dotted line potential 17 illustrated in FIG. 4. The potential 19 underlying the electrode 9a is determined by the voltage source $V_1$. Whenever the clock signal $\phi_{diff}$ causes the potential on the diode diffusion 5 to be raised above the solid line potential 15, the diode diffusion 5 injects charge carriers (holes) into a potential well 21 underlying the control electrode 11a. The depth of the potential well 21 is determined by the magnitude of the applied electrode voltage $V_2$ consisting of an offset d.c. biasing component $V_2$ (DC) and a signal voltage $V_s$. The bias voltage $V_2$ (DC) causes the conductivity of a local region 22 near the surface of the substrate 1 to be inverted to create a pn junction 22a at the interface between the inverted region 22 and the remainder of the substrate 1. When the diffusion clock signal $\phi_{diff}$ causes the potential of the input diffusion 5 to fall to the dashed line position 17 shown in FIG. 4, excess charge above the barrier potential 19 will flow back into the input diffusion 5 so that the remaining charge in the potential well 21 is a precise function of the electrode voltage $V_2$ and therefore also a precise function of the applied signal voltage $V_s$ and of the depletion capacitance of the pn junction 22a in parallel with the oxide capacitance under electrode 11a. Subsequently, the clock signal $\phi_1$ is turned on, causing the surface potential underlying the clocked electrodes 9b, 11b to fall from the solid line potential barrier position 23 to the dashed line potential well position 25 illustrated in FIG. 4, after which the charge packet previously stored in the potential well 21 is transferred along the length of the charge flow channel 3 under the control of the clock signal $\phi_1$.

The foregoing manner of charge injection is discussed in the above-reference Sequin publication, and when used to process signals, it is imperative that the amount of charge injected into the potential well 21 beneath the control electrode 11a have a precisely linear relationship with the applied signal voltage $V_s$.

While not subscribing to any particular theory, the electrode voltage $V_2$ applied to the control electrode 11a is believed to induce the electrical surface potential well 21 in the surface of the substrate 1 by depleting the substrate of carriers in the region deeper or more negatively than neighboring regions under electrodes 9a and 9b. Referring to the simplified a.c. equivalent circuit illustrated in FIG. 5 in conjunction with FIG. 3, the capacitance $C_{ox}$ of electrode 11a to the silicon surface with the silicon dioxide layer 13 forming the dielectric is schematically modeled as a capacitor 24. Capacitor 26 represents the small signal depletion capacitance $C_{cd}$ of the pn junction 22a created by the local inversion of the substrate 1 under the control of the electrode 11a. The pn junction 22a corresponding to the depletion diode capacitor 26 is reverse biased by a nominal 10 volts due to a positive 5 volt bias supplied to the semiconductive substrate 1 and a nominal negative 5 volt surface potential. The nominal negative 5 volt surface potential results from an offset d.c. bias $V_2$ (DC) included in the electrode voltage $V_2$ to establish a proper surface potential for charge transfer and to accommodate the threshold voltage characteristic of the structure. The small signal depletion capacitance corresponds to dQ/dV for small signal variations about the nominal 10 volt reverse bias and is commonly termed supply depletion capacitance in the art. The amount of signal charge QD stored in the potential well 21 in the inverted region 22 is a function of the applied signal voltage $V_s$ multiplied by the depletion capacitance $C_{cd}$ of the pn junction 22a, corresponding to the model depletion capacitor 26. The depletion capacitance $C_{cd}$ changes with variations in the applied voltage $V_s$. As a result, the amount of signal charge QD stored in the potential well 21 is a non-linear function of the signal voltage $V_s$.

Figure 5:
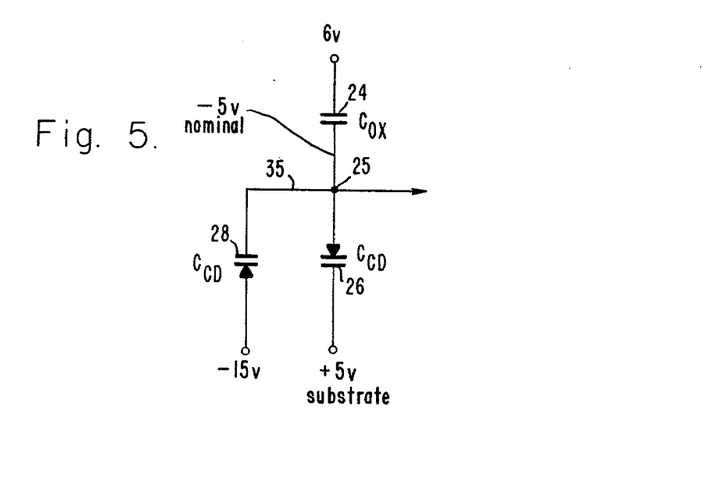
FIG. 5 is a circuit diagram corresponding to the schematic diagram of FIG. 3.
Figure 6:
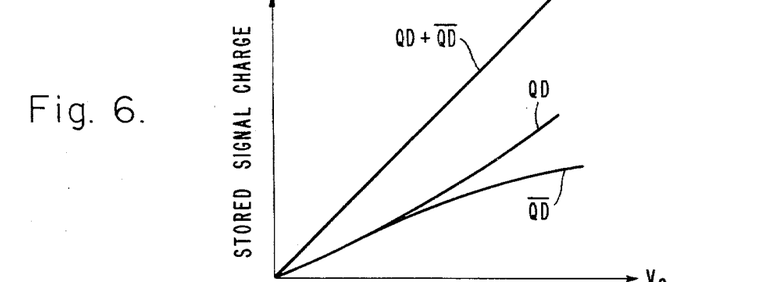
FIG. 6 is a graph illustrating the relative differences between the charge induced in the depletion capacitance compensating diode and the charge induced by the electrode capacitance as a function of applied voltage corresponding to the device of FIG. 1.

The non-linear relationship between the amount of signal charge QD stored in the potential well 21 and the applied voltage $V_s$ on the control electrode 11a may be improved or substantially linearized over a region of interest by the addition of a depletion capacitance compensating diode 28. FIGS. 3 and 5 show the depletion capacitance compensating diode 28 having a depletion capacitance $\overline{C_{cd}}$ connected in parallel with the depletion capacitor 26 with its anode and cathode arranged in a polarity reversed with respect to the pn junction 22a corresponding to the depletion capacitor 26. A negative 15 volt bias ($-15$ v) is applied to the anode of the added depletion capacitor causing a nominal 10 volt reverse bias across the junction of compensating diode 28. Thus, the two diode capacitors 26 and 28 are connected in opposing polarity while both of them are reverse biased, each at a nominal 10 volts, for example. As a result, variations in the applied signal voltage $V_s$ on the control electrode 11a cause the capacitance of the compensating diode 28 to vary in an opposite manner with respect to the capacitance of the depletion capacitor 26. Thus, non-linear variations in the amount of signal charge QD stored in the depletion capacitor 26 are offset by substantially opposite non-linear variations in the amount of signal charge $\overline{QD}$ stored in the compensating diode capacitor 28, as illustrated in FIG. 6 by the curves labeled QD and $\overline{QD}$ respectively. Because the two capacitors 26 and 28 are connected together at node 25, the amount of signal charge stored is the sum QD+$\overline{QD}$ of the charges of both capacitors, and this sum is a nearly linear function of the applied signal voltage $V_s$, as indicated by the nearly straight-line curve labeled QD+$\overline{QD}$ in FIG. 6. Additional signal charge $Q_{ox}$ is stored on $C_{ox}$ which is considered substantially constant over small signal variations. Referring to FIG. 3, the linearizing function of the depletion capacitance compensator 28 illustrated in FIG. 5 may be intuitively understood by noting that an increase in the applied voltage $V_s$ causes a proportional decrease in the bias voltage across the depletion capacitor 26 and a corresponding increase across the compensating capacitor 28, while the converse applies whenever the applied signal voltage $V_s$ decreases. Thus, the non-linearities of the two capacitors 26, 28 tend to cancel out when summed together, as illustrated in FIG. 6.

In the discussions to follow, increased n and an increased p indicate higher impurity concentrations, i.e. highly doped regions, than n and p type semiconductor materials respectively and are also referred to as n+ and p+ respectively. Referring to FIG. 1, one method of implementation of the depletion capacitance compensator diode 28 requires an additional implant 27 of p type conductivity surrounded by a channel stop region 29 of increased n type conductivity external of the charge flow channel 3. The depletion capacitance compensating diode 28 is formed by implanting a region 28a of increased n type conductivity in the p type area or well 27. The depletion capacitance compensating diode 28 is connected to the potential well 21 beneath the control electrode 11a in the charge flow channel 3 and a connecting conductor 35. The negative 15 volt bias referred to above is applied to the compensating diode 28 by means of a region 37 of increased p type conductivity formed in the p type well 27 and connected to a negative 15 volt voltage source through a conductor 39. Although the coupling diffusion 33 in the charge flow channel 3 causes charge transfer beneath the control electrode 11a to function in the manner of a bucket brigade device instead of a charge coupled device, the resulting loss of speed and transfer for efficiency is not expected to cause a significant loss in performance.

Figure 7:
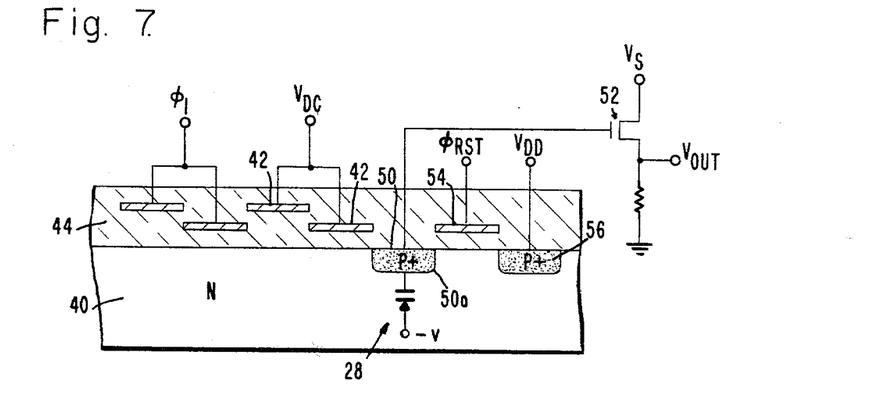
FIG. 7 is a schematic diagram illustrating a second embodiment of the invention in which a depletion capacitance compensating diode is connected in parallel with the capacitance of a floating diffusion in a charge coupled device.
Figure 8:
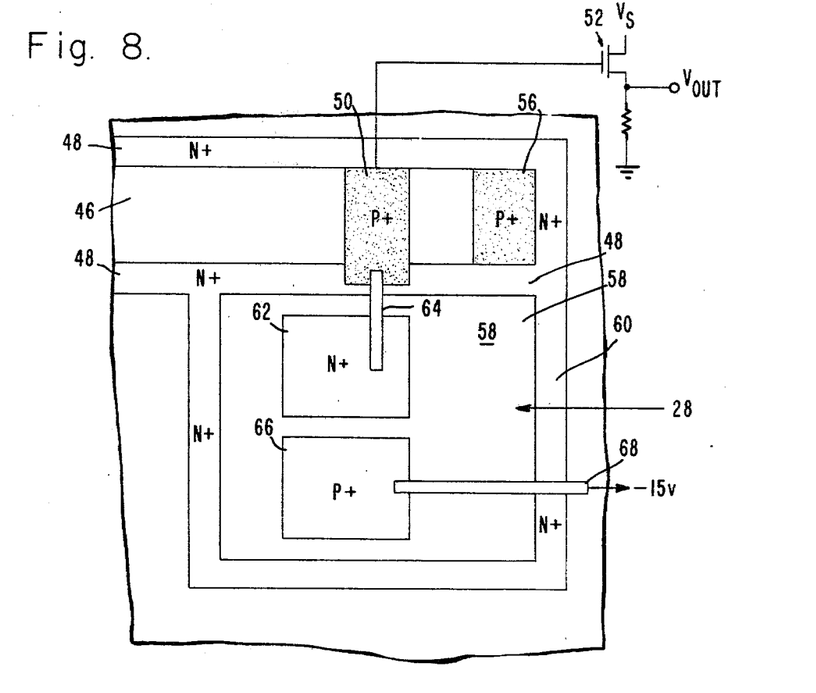
FIG. 8 is a top view of a charge coupled device corresponding to the schematic diagram of FIG. 7.

FIG. 7 and 8 illustrate the use of the depletion capacitance compensation of this invention to linearize the output voltage of a charge sensing floating diffusion as a function of the amount of charge sensed. A charge coupled device on a semiconductor substrate 40 includes a plurality of electrodes 42 insulated from the substrate 40 by a silicon dioxide layer 44 and a charge flow channel 46 beneath the plurality of electrodes 42 defined by a channel stop 48. Charge is transferred beneath the plurality of electrodes 42 onto a floating diffusion 50, producing a voltage on the gate of a metal oxide field effect transistor (MOSFET) 52 connected to the diffusion 50 to create an output voltage $V_{out}$ at the source of the MOSFET 52. The potential of the floating diffusion 50 is periodically reset by application of a reset clock signal $\phi_{rst}$ to a reset electrode 54 disposed between the floating diffusion 50 and a drain diffusion 56 which is reverse biased by connection to a drain voltage source $V_{dd}$. In the exemplary embodiment of FIG. 7, the substrate 40 is of n type conductivity, while the diffusions 50, 56 are of increased p type conductivity to provide a p-channel charge coupled device of a type well known in the art. The output voltage $V_{out}$ is a function of the depletion capacitance $C_{cd}$ at the junction 50a between the floating diffusion 50 and the substrate 40. FIG. 7 schematically illustrates a reverse biased depletion capacitance compensating diode 28 connected in parallel with the depletion capacitance of the junction 50a. Referring to the top view of FIG. 8, an implant 58 of p type conductivity is surrounded by a channel stop 60 of increased n type conductivity and is located adjacent the channel stop 48 defining the charge flow channel 46 near the floating diffusion 50. The compensating diode 28 is formed by implanting a diffusion 62 of increased n type conductivity in the p type well 58, and connecting the diffusion 62 to the floating diffusion 50 by a metal conductor 64 which spans the channel stop 48. In accordance with the embodiment illustrated in FIG. 1, the depletion capacitance compensating diode 28 of FIG. 7 is reverse biased by connection to a negative 15 volt source by means of a diffused region 66 of increased p type conductivity implanted in the well 58 having a metal conductor 68 connected thereto. The depletion capacitance compensating diode 28 of FIG. 7 is similar to the depletion capacitance compensator 28 of FIG. 1 and functions in an identical manner to compensate for variations in the depletion capacitance of the junction =a.

Figure 9:
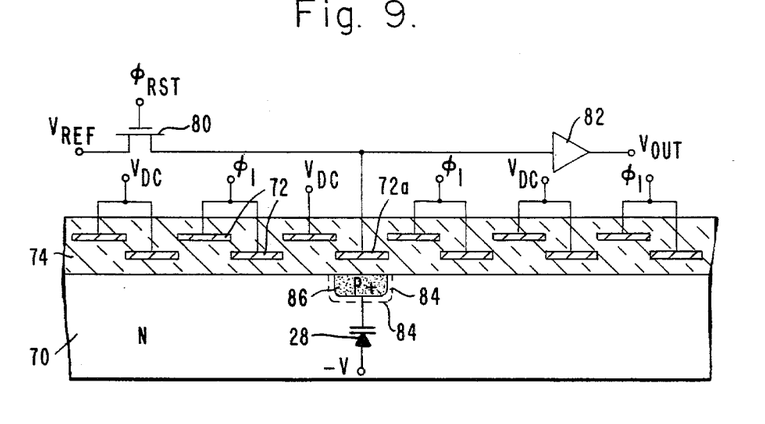
FIG. 9 is a schematic diagram illustrating the connection of a depletion capacitance compensating diode under a charge sensing floating electrode.
Figure 10:
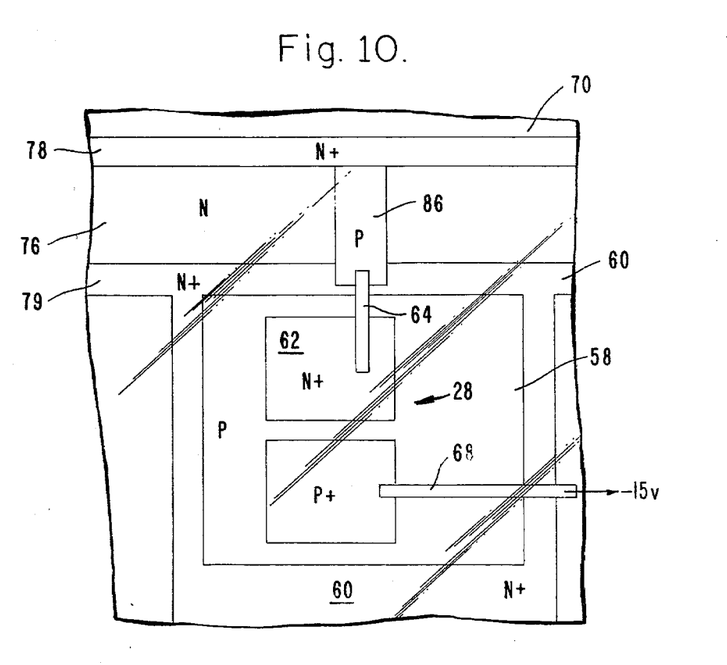
FIG. 10 is a top view of a charge coupled device corresponding to the schematic diagram of FIG. 9.

The depletion capacitance compensator of this invention is also useful to provide for linear charge sensing by floating electrodes in charge coupled devices. Referring to FIGS. 9 and 10, a charge coupled device formed on a semiconductive substrate 70 includes a plurality of electrodes 72 formed in an insulating layer of silicon dioxide 74, alternate pairs of electrodes connected to receive the clock signal $\phi_1$ and remaining pairs connected to a constant voltage source $V_{dc}$ to effect charge transfer in a charge flow channel 76 defined by channel stops 78 and 79. In the exemplary embodiment of FIGS. 9 and 10, the substrate 70 is of n type conductivity and the channel stops are of increased n type conductivity to provide a p-channel charge coupled device of a type well known in the art. Each charge packet transferred through the charge flow channel 76 is sensed by a floating electrode 72a which has its potential periodically reset by application of a reference voltage $V_{ref}$ through a reset switch 80 controlled by the reset clock signal $\phi_{rst}$. The voltage output of the floating electrode 72a may be buffered by an isolation amplifier 82 to produce an output voltage $V_{out}$.

Each charge packet transferred beneath the floating electrode 72a resides in a region 84 of inverted p type conductivity corresponding to the extent of the charge packet. The voltage potential of the floating electrode 72a is a function of the initial voltage $V_{ref}$ and of the size of the charge packet residing thereunder and of the depletion capacitance of the pn junction formed at the interface 84a between the inverted p type region 84 and the n type substrate 70. FIG. 9 and FIG. 10 indicate schematically that a depletion capacitance compensating diode 28 is connected to the inverted p type region 84 by means of a coupling diffusion 86 of increased p type conductivity located directly beneath the floating electrode 72a and extending across the width of the channel 76. A p type region 58 surrounded by an increased n type channel stop 70 is disposed adjacent the connecting diffusion 86. The depletion capacitance compensating diode is formed by implanting a diode diffusion 72 of increased n type conductivity in the p type region 58 in the same manner as described above in connection with FIG. 8. A metal conductor 64 connects the compensating diode diffusion 62 to the increased p type diffusion 86. The depletion capacitance of the np diode formed between the increased n type diode diffusion 62 and the p type region 58 compensates for variations in the depletion capacitance of the pn junction at the interface 84a between the inverted region 84 and the substrate 70 in the manner described above in connection with the depletion capacitance compensating diode 28 of FIG. 1.

Figure 11:
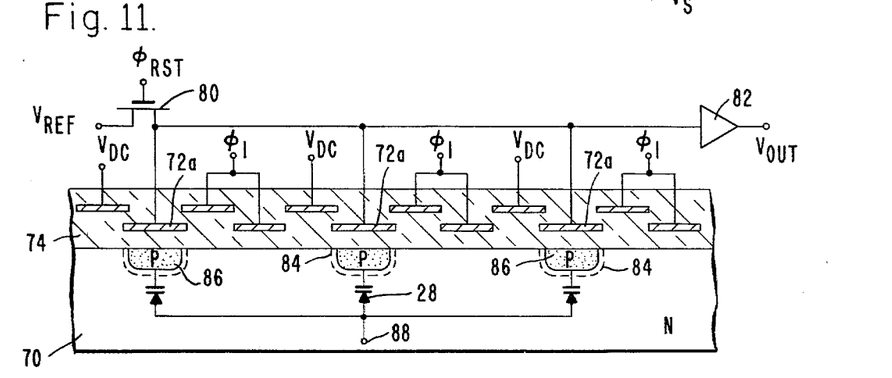
FIG. 11 is a schematic diagram of a charge coupled device transversal filter in which a single depletion capacitance compensating diode is connected to the electrode capacitance of the transversal filter.

FIG. 11 illustrates an extension of the structure of FIG. 9 to a charge coupled device transversal filter having a plurality of floating electrodes 72a formed in the oxide layer 74 over the semiconductive substrate 70. A plurality of depletion capacitance compensating diodes 28 are connected to each of a plurality of diffusions 86 under the plurality of floating electrodes 72a to compensate for the individual variations in the depletion capacitances of the plurality of inverted regions 84 under the floating electrodes 72a in the same manner as described above with reference to FIGS. 9 and 10. The anodes of the depletion capacitance compensating diodes 28 are connected to a common node 88 for connection to a bias voltage $-V$.

Figure 12:
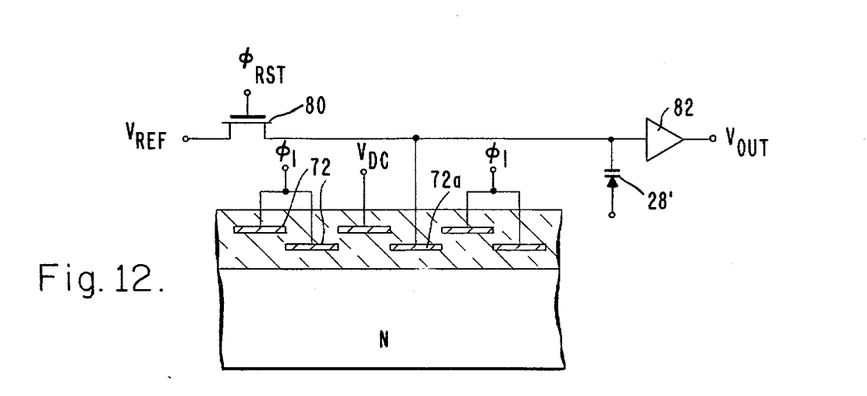
FIG. 12 is a schematic diagram of an alternative mode of the embodiment of FIG. 9 in which the depletion capacitance compensating diode is connected to the overlying electrode and may be provided externally of the charge coupled device.

FIG. 12 illustrates an alternative method for compensating for variations in the depletion capacitance of the inverted region beneath the floating electrode, in which a charge coupled device similar to that illustrated in FIG. 9 has a depletion capacitance compensating diode 28 comprising two adjoining semiconductive regions of p and n type conductivity respectively, connected directly to the floating electrode 72a, in contrast to the technique illustrated in FIG. 9 in which the compensating diode 28 is connected to the substrate surface at the potential well.

Figure 13:
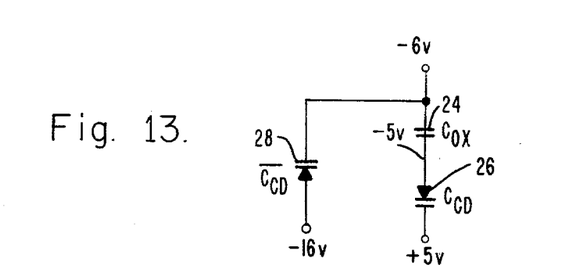
FIG. 13 is a circuit diagram of the device of FIG. 12.

FIG. 13 is a circuit diagram corresponding to the device of FIG. 12, clearly showing that the depletion capacitance compensating diode 28 interacts with the depletion capacitance $C_{cd}$ of capacitor 26 corresponding to the inverted region beneath the floating electrode 72a through the capacitance $C_{ox}$ of the oxide layer 74. The embodiment illustrated in FIG. 12 operates in a manner similar to that described in connection with FIGS. 1-6 to provide a voltage output which is a nearly linear function of the sensed charge beneath the floating electrode 72a.

Figure 14:
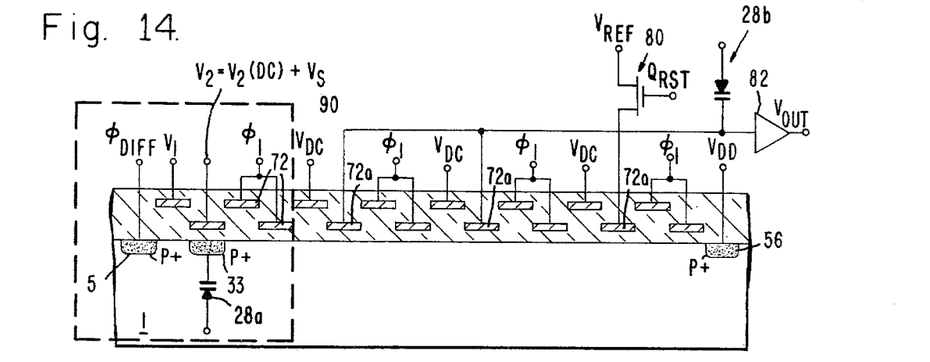
FIG. 14 is a schematic diagram of the preferred embodiment of the invention.

FIG. 14 is the presently preferred embodiment of the invention in which charge is injected into a charge coupled device transversal filter by means of a charge injection structure 90 identical to that illustrated in FIGS. 1, 2 and 3 incorporating a first depletion capacitance compensating diode 28a and is also an application of the concept of FIG. 12 to the charge coupled device transversal filter having a plurality of floating electrodes 72a connected together to output buffer amplifier 82 and to a second depletion capacitance compensating diode 28b. Thus, in the preferred embodiment of the invention illustrated in FIG. 14, the size of charge packets injected into the CCD channel is a substantially linear function of the applied signal voltage $V_s$ while the output voltage $V_{out}$ is a substantially linear function of the summation of the charges sensed beneth the plurality of floating electrodes 72a because of the use of the depletion capacitance compensating diodes 28a and 28b of the present invention to linearize both charge injection and charge sensing. While FIG. 14 illustrates a first depletion capacitance compensator 28a linearizing charge injection into the charge coupled device with the use of a second depletion capacitance compensator 28b connected to the output of the floating electrodes 72a, it should be recognized that it is not necessary to use both of the depletion capacitance compensators 28a and 28b together, since each one operates independently of the other.

Even though the above described embodiments are p-channel charge coupled devices, the invention is equally applicable to n-channel charge coupled devices or any semiconductive devices.

While several embodiments of the invention have been described in detail, it should be recognized that other variations not described herein are possible which do not depart from the scope of this invention.

What is claimed is:

1. A charge coupled device formed on a semiconductive layer of a first conductivity type having a charge flow channel adapted for transfer therethrough of charge packets, having depletion capacitance compensation, comprising:

a compensating diode formed in or near said layer adjacent to said channel, including a first conductivity type portion and a second conductivity type portion;

a charge storage region of said second conductivity type formed in said channel adapted for storage of a charge packet therein;

a conductor connected directly between said charge storage region and said first conductivity type portion of said compensating diode; and means for maintaining a reverse bias potential across said first and second conductivity type portions of said compensating diode.

2. The device of claim 1 wherein said layer is of N-type conductivity.

3. The device of claim 2 wherein said region comprises a P-type diffusion spanning said channel.

4. The device of claim 1 further comprising an insulated floating electrode overlying said region.

5. A charge coupled device having depletion capacitance compensation, comprising:
   a semiconductive layer of a first conductivity type;
   a channel stop of said first conductivity type defining a charge flow channel in said layer;
   a first region of a second conductivity type in said layer;
   a channel stop disposed near the boundary of said first region;
   a diode comprising a portion of said first conductivity type disposed in said first region;
   a second region of said second conductivity type spanning at least a portion of said charge flow channel; and
   a conductor directly connecting said diode portion and said second region.

6. A charge coupled device having improved linearity, comprising:
   a semiconductive layer of a first conductivity type;
   a charge flow channel in said layer adapted for transfer therethrough of charge packets;
   a region of a second conductivity type formed in said channel adapted for storing a charge packet therein;
   a charge sensing floating electrode overlying said region and insulated therefrom;
   a depletion capacitance compensating diode having adjoining semiconductive portions of first and second conductivity types, the first conductivity type portion of said compensating diode being directly connected to said region by means of a conductor.

7. A charge coupled device transversal filter, having depletion capacitance compensation, comprising:
   a semiconductive layer of a first conductivity type;
   a charge flow channel in said semiconductive layer adapted for transfer therethrough of charge packets;
   a plurality of floating electrodes overlying said channel;
   at least one region of a second conductivity type formed in said channel underlying a corresponding one of said floating electrodes, said region adapted to store a charge packet therein;
   a depletion capacitance compensating diode disposed externally of said charge flow channel having first and second adjoining semiconductive portions of said first and second conductivity types respectively; and
   a conductor directly connecting said first conductivity type portion of said diode with said one region.

8. A charge coupled device transversal filter having depletion capacitance compensation, comprising:
   a semiconductive layer of a first conductivity type;
   a plurality of charge sensing floating electrodes overlying said layer;
   a plurality of regions of a second conductivity type underlying said plurality of floating electrodes; and
   a depletion capacitance compensating diode having first and second adjoining semiconductive portions of said first and second conductivity types respectively, said first conductivity portion being directly connected to at least one of said plurality of regions by means of a conductor.

9. The device of claim 8 further comprising a plurality of depletion capacitance compensating diodes each having adjacent semiconductive portions of first and second conductivity type respectively, said first conductivity type portions connected to respective ones of said plurality of regions.

10. The device of claim 5, 6, 7 or 8, further comprising means for maintaining a reverse bias potential across said diode.

* * * * *